(12) United States Patent
Van Der Laan et al.

(10) Patent No.: US 7,274,434 B2
(45) Date of Patent: Sep. 25, 2007

(54) LITHOGRAPHIC APPARATUS AND DEVICE MANUFACTURING METHOD

(75) Inventors: Hans Van Der Laan, Veldhoven (NL); Manfred Bernhard Suddendorf, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 186 days.

(21) Appl. No.: 10/995,525

(22) Filed: Nov. 24, 2004

(65) Prior Publication Data

US 2006/0109436 A1    May 25, 2006

(51) Int. Cl.
*G03B 27/68* (2006.01)
*G03B 27/42* (2006.01)
*G03B 27/54* (2006.01)

(52) U.S. Cl. ............................. 355/52; 355/53; 355/67

(58) Field of Classification Search ................. 355/52, 355/53, 55, 67–71; 250/548; 356/399–401
See application file for complete search history.

(56) References Cited

U.S. PATENT DOCUMENTS

| | | | | |
|---|---|---|---|---|
| 5,726,740 A | * | 3/1998 | Shiozawa et al. ............. | 355/67 |
| 6,304,317 B1 | * | 10/2001 | Taniguchi et al. ............ | 355/55 |
| 6,522,390 B2 | * | 2/2003 | Suzuki et al. ................. | 355/53 |
| 6,538,722 B2 | * | 3/2003 | Matsumoto et al. .......... | 355/53 |
| 6,661,498 B1 | * | 12/2003 | Hirukawa ..................... | 355/71 |
| 6,930,754 B1 | * | 8/2005 | Sugita et al. ................. | 355/53 |

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus includes an illumination system configured to provide a beam of radiation of radiation; a support configured to support a patterning device configured to impart a pattern to the beam of radiation; a substrate table configured to hold a substrate; a projection system configured to project the patterned beam onto a target portion of the substrate, the projection system and/or illumination system including a focusing element; a plurality of stop discs each having an aperture therethrough different from the size and/or shape of the apertures of the other stop discs; and a mechanism configured to exchangeably place a selected one of the stop discs adjacent to the focusing element.

20 Claims, 10 Drawing Sheets

20 e      20 f      20 g      20 h (e)      (f)      (g)      (h)

LITHOGRAPHIC APPARATUS AND DEVICE MANUFACTURING METHOD

BACKGROUND OF THE INVENTION

1. Field of the Invention

The present invention relates to a lithographic apparatus and to a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. including part of one or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion at once, and scanners, in which each target portion is irradiated by scanning the pattern through the beam of radiation in a given direction (the "scanning"-direction) while synchronously scanning the substrate parallel or anti-parallel to this direction.

Between the reticle and the substrate is disposed a projection system that images the irradiated portion of the reticle onto the target portion of the substrate. The projection system includes components to direct, shape and/or control the beam of radiation, and these components typically include refractive optics, reflective optics, and/or catadioptric systems, for example.

A consideration in lithography is the size of features of the pattern applied to the substrate. It is desirable to produce apparatus capable of resolving features as small and close together as possible. A number of parameters affect the available resolution of features, and one of these is the wavelength of the radiation used to expose the pattern.

It is expected that the use of EUV lithography will enable the manufacture of feature sizes down to 32 nm using radiation with an EUV (Extreme Ultra Violet) wavelength between 5 and 20 nm, typically 13.5 nm. Radiation at this wavelength is typically strongly absorbed by most materials and conventional refractive optics are generally considered to be unsuitable for use with such radiation. The optics in a projection system for use with EUV lithography should therefore be based on mirrors, which can only operate in a high vacuum (UHV) environment. The projection system is therefore enclosed in a projection optics box (POB) which is kept under vacuum.

Similar considerations apply for lithography using radiation having a wavelength falling outside the EUV band. For example, a projection system for lithography using radiation having a wavelength of 193 nm may also include mirrors instead of, or in addition to, refractive optics. The POB may therefore need to be kept under a vacuum or at least in a controlled environment for non-EUV lithography.

Furthermore, considerations that apply to the projection system will also apply to the illumination system used to supply the beam of radiation to the reticle. As with the projection system, the illumination system includes components to direct, shape and/or control the beam of radiation, and these components typically include refractive optics, reflective optics, and/or catadioptric systems, for example. As with the projection system, the illumination system may need to be kept in a controlled environment or under vacuum.

The projection system and/or illumination system generally also includes elements to set the numerical aperture, commonly referred to as the "NA") of the projection system (and/or illumination system. In some prior art systems, an aperture adjustable NA-diaphragm or iris diaphragm may be provided in a pupil of the projection system and/or illumination system. Particularly in the case of EUV lithography, for most common projection optics designs the space around the optical components is very restricted, making the use of an adjustable diaphragm impractical. Furthermore, it is difficult to provide an elliptical diaphragm for off-axis reflective systems.

Yet further, an adjustable diaphragm provides substantially circular apertures. However, different shaped apertures can improve imaging performance for specific structures. For example, an elliptical aperture is useful for off-axis reflective systems. It is not possible to produce apertures having such shape using a conventional diaphragm.

SUMMARY OF THE INVENTION

It is an aspect of the present invention to provide a solution to the problem of providing a lithographic apparatus having a variable NA, for example combining the benefits of a traditional iris diaphragm with additional, alternative apertures and/or filters.

It is a yet further aspect of the present invention to provide a mode of improving imaging performance by pupil shaping/filtering in an EUV projection system of a lithographic apparatus.

In accordance with one embodiment of the present invention there is provided a lithographic apparatus including an illumination system configured to provide a beam of radiation; a support configured to support a patterning device, the patterning device configured to impart a pattern to the beam of radiation; a substrate table configured to hold a substrate; a projection system configured to project the patterned beam onto a target portion of the substrate; and a stop changer configured to exchangeably place a selected one of a plurality of stop discs adjacent to a focusing element.

The focusing element may be provided in the illumination system or the projection system.

The focusing element may include a single optical element with a focusing function, e.g. a single lens element or a single (e.g. non-flat) mirror, and may reflect or refract the beam of radiation.

The selected stop disc is exchangeably placeable in or adjacent to a pupil plane of the focusing element.

The stop disc is positioned in or near the pupil plane of the projection system or illumination system.

A size of the aperture of the selected stop disc determines a numerical aperture (NA) of the projection system.

Each stop disc may be alternatively termed a "pupil" or "blade".

The focusing element may reflect or refract the beam of radiation.

The stop changer may include a disc positioning mechanism to selectively place one of the stop discs adjacent the focusing element.

The stop changer may include a disc changing mechanism to select one of the stop discs and supplying the selected stop disc to the disc positioning mechanism.

The disc changing mechanism may include a receptacle to store the stop discs not supplied to the disc positioning mechanism.

The lithographic apparatus may also include the plurality of stop discs.

The stop discs may each include a differently apertured member, i.e. may each include a member having a distinct aperture different from the apertures of the other stop disc members, e.g. in size and/or shape.

Each stop disc may be a first disc having a circular aperture of a first size, a second disc having a circular aperture of a second size greater than the first size, a disc having an elliptical aperture, a disc having an aperture with a central obscuration, a disc having a square aperture, a disc having a hexagonal aperture, a disc having a plurality of apertures, or a disc for correcting pupil apodization. An elliptically shaped aperture may correct for Horizontal and Vertical (H-V) orientation differences caused by errors in the illuminator (ellipticity), the projection system or the mask. An aperture with a central obscuration may increase contrast for many structures by partially blocking zeroth order light.

An aperture of one or more of the stop discs may be provided with a filter or membrane, which may act as a phase and/or amplitude filter and may allow for aberration correction. Alternatively an aperture of one or more of the stop discs may be provided with a mesh.

The selected stop disc may be provided before or in front of the focusing element such that, in use, radiation passes through the aperture of the selected stop disc prior to reaching the focusing element. In use, the radiation does not need to thereafter pass back through the aperture.

A disc delivery mechanism may be provided to deliver a selected stop disc from the disc changing mechanism to the disc positioning mechanism.

A magazine may be provided to hold the plurality of stop discs when not in use.

The focusing element may be a reflective lens (i.e. a mirror). The arrangement described above is particularly appropriate when the radiation in the beam of radiation has a wavelength in the EUV region, i.e. between about 5 and about 20 nm, although it will be appreciated that the present invention may be used in conjunction with radiation of any wavelength, such as in the UV region, e.g. in the range of 5 nm to 400 nm and possibly of around 193 nm or 157 nm.

In accordance with a further embodiment of the present invention there is provided a device manufacturing method including providing a beam of radiation using an illumination system; patterning the beam of radiation; projecting the patterned beam of radiation onto a target portion of a substrate; and adjusting a numerical aperture of a focusing element of the illumination system or radiation system by exchangeably placing a selected stop disc adjacent the focusing element.

In accordance with a still further embodiment of the present invention, a device is manufactured according the method described above.

In accordance with yet another embodiment of the present invention, a lithographic apparatus includes an illumination system configured to provide an EUV beam of radiation; a support configured to support a patterning device, the patterning device configured to impart a pattern to the beam of radiation; a substrate table configured to hold a substrate; a projection system configured to project the patterned EUV beam of radiation onto a target portion of the substrate; and a stop changer configured to exchangeably place a selected one of a plurality of stop discs at a position within the EUV beam of radiation to shape and/or filter the EUV beam of radiation Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5 to 20 nm), as well as particle beams, such as ion beams or electron beams.

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning devices may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support supports, e.g. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, catadioptric optical systems, magnetic, electromagnetic and electrostatic optical systems as appropriate for example for the exposure radiation being used, or for other factors such as the use of an immersion fluid or the use of a vacuum. Any use of the term "lens" herein may be considered as synonymous with the more general term "projection system".

The lithographic apparatus may also encompass various types of optical components, including refractive, reflective, catadioptric, magnetic, electromagnetic and electrostatic optical components to direct, shape, or control the beam of radiation, and such components may also be referred to herein, collectively or singularly as a "lens."

The lithographic apparatus may be of a type having two (dual stage) or more substrate tables (and/or two or more mask tables). In such multiple stage machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings, in which corresponding reference symbols indicate corresponding parts, wherein.

DETAILED DESCRIPTION

Figure 1:
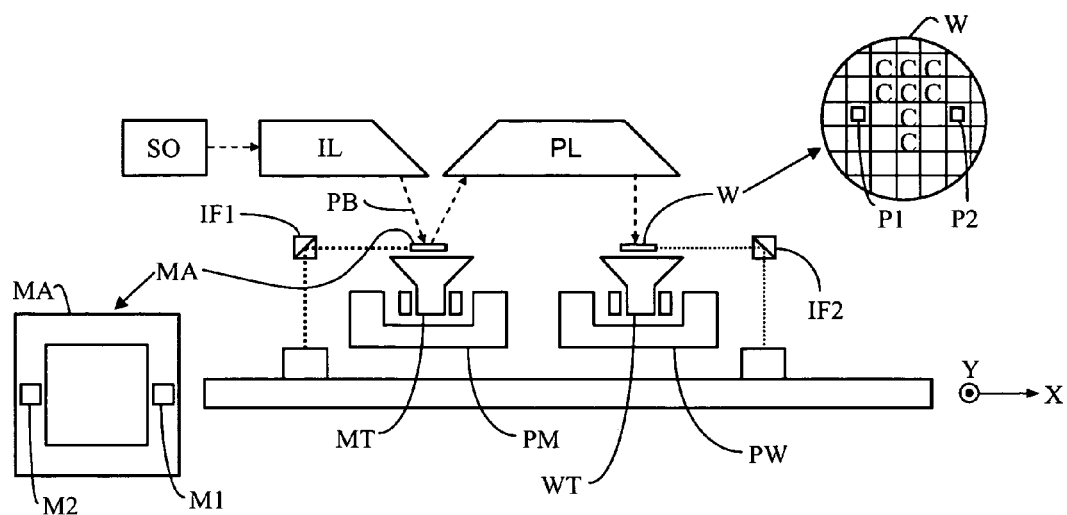
FIG. 1 depicts a lithographic apparatus according to the present invention.

FIG. 1 schematically depicts a typical lithographic apparatus according to the present invention. The apparatus includes an illumination system (illuminator) IL configured to provide a beam of radiation PB (e.g. UV or EUV radiation); a first support (e.g. a mask table) MT configured to support a patterning device (e.g. a mask) MA and connected to a first positioning device PM that accurately positions the patterning device MA with respect to a projection system PL; a substrate table (e.g. a wafer table) WT configured to hold a substrate (e.g. a resist-coated wafer) W and connected to second positioning device PW that accurately positions the substrate W with respect to the projection system PL; and the projection system (e.g. a reflective projection lens) PL configured to image a pattern imparted to the beam of radiation PB by patterning device MA onto a target portion C (e.g. including one or more dies) of the substrate W. The patterning device MA is configured to impart the beam of radiation PB with a pattern in its cross-section.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives radiation from a source SO. The source SO and the lithographic apparatus may be separate entities, for example, when the source SO is a plasma discharge source. In such cases, the source SO is not considered to form part of the lithographic apparatus and the radiation is generally passed from the source SO to the illuminator IL with the aid of a radiation collector including, for example, suitable collecting mirrors and/or a spectral purity filter. In other cases the source SO may be an integral part of the apparatus, for example, when the source SO is also contained in a vacuum. The source SO and the illuminator IL may be referred to as a radiation system.

The illuminator IL may include adjusting means for adjusting the angular intensity distribution of the beam. Generally, at least the outer and/or inner radial extent (commonly referred to as σ-outer and σ-inner, respectively) of the intensity distribution in a pupil plane of the illuminator IL can be adjusted. The illuminator IL provides a conditioned beam of radiation PB having a desired uniformity and intensity distribution in its cross-section.

The beam of radiation PB is incident on the mask MA, which is held on the mask table MT. Being reflected by the mask MA, the beam of radiation PB passes through the projection system PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 (e.g. an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper, as opposed to a scanner, the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width in the non-scanning direction of the target portion in a single dynamic exposure, whereas the length of the scanning motion determines the height in the scanning direction of the target portion.

3. In another mode, the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
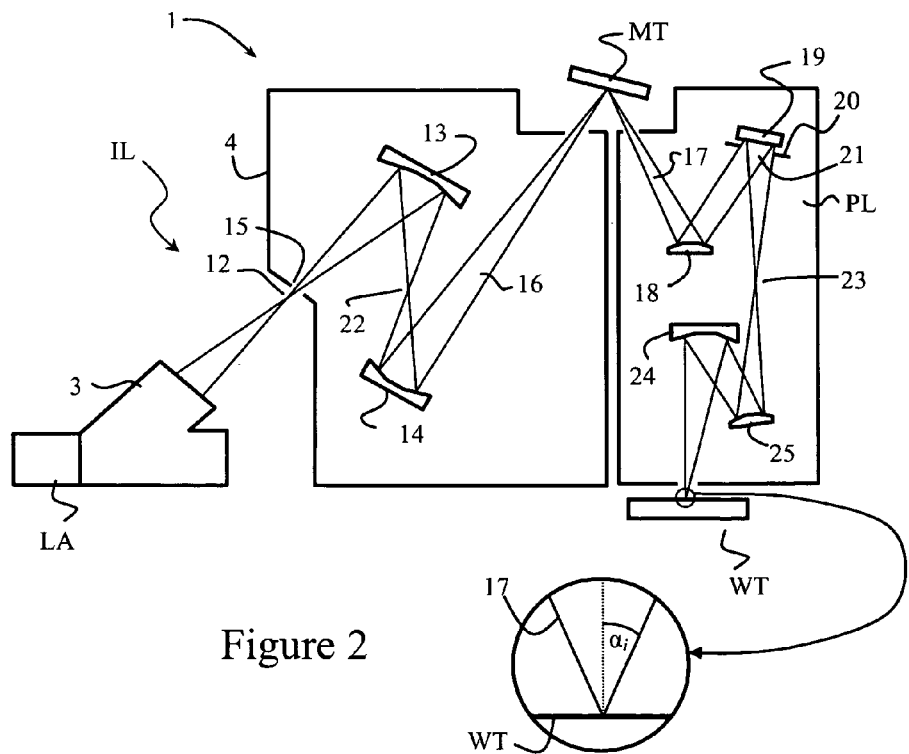
FIG. 2 depicts a lithographic apparatus for use with extreme ultra-violet (EUV) radiation according to an embodiment of the present invention.

FIG. 2 shows a side view of an EUV lithographic apparatus 1 in accordance with an embodiment of the present invention. It will be noted that, although the arrangement is different to that of the apparatus shown in FIG. 1, the principle of operation is similar. The apparatus 1 includes an illumination system IL having a source-collector module or radiation unit 3, illumination optics unit 4, and a projection system PL. Radiation unit 3 is provided with a radiation source LA which may be formed by a discharge plasma. The radiation from the radiation unit 3 creates a virtual source at an intermediate focus point 12. The illumination system IL is configured such that the intermediate focus 12 is disposed at an aperture 15 in the illumination optics unit 4. The beam of radiation 16 is reflected in illumination optics unit 4 via reflective element 13, through an intermediate focus 22, and via a further reflective element 14 onto a reticle or mask positioned on reticle or mask table MT. A patterned beam 17 is formed which is imaged by projection system PL via reflective elements 18, 19, through an intermediate focus 23 and via reflective elements 24, 25 onto wafer stage or substrate table WT. More elements than shown may generally be present in the radiation unit 3, illumination optics unit 4 and projection system PL.

One of the reflective elements 19 acts as a pupil and therefore has in front of it an NA stop disc 20 having an aperture 21 therethrough. The size of the aperture 21 determines the angle $\alpha_i$ subtended by the beam 17 of radiation as it strikes the substrate table WT. This angle gives rise to a parameter involved in the projection process, the Numerical Aperture (NA), which is defined as $$NA = n \sin \alpha_i$$

where n is the refractive index of the medium surrounding the substrate table WT. Using EUV the projection system is operated under vacuum, in which n=1.000, and even in air n=1.003, so in general the Numerical Aperture can be defined by NA≈sin $\alpha_i$.

The value of NA controls the resolution of the apparatus. The resolution can be represented as the critical dimension (CD) of the smallest feature which can be imaged, and this is determined by $$CD = k_1 \frac{\lambda}{NA}$$

where $k_1$ is a constant. Thus it can be seen that the higher the value of NA, the better the resolution, i.e. the smaller the feature which can be imaged.

However, as NA is increased the depth of focus (DOF) of the projection system PL is decreased. Therefore for operations which do not require exceptionally high resolution, it is desirable to reduce the value of NA so as to increase the depth of focus and thus the tolerance of the positioning of the substrate on the substrate table WT.

The aperture is used to capture radiation diffracted from the reticle MA. This diffracted radiation is used for image formation. The extent of the diffraction depends on the size of the features on the reticle. Thus it can be seen that the user needs to be able to decrease or increase the NA. This is achieved by replacing the NA stop disc 20 with another stop disc having a different aperture therethrough. The different aperture changes the angle $\alpha_i$ subtended by the radiation beam 17 at the substrate table WT.

Figure 3A:
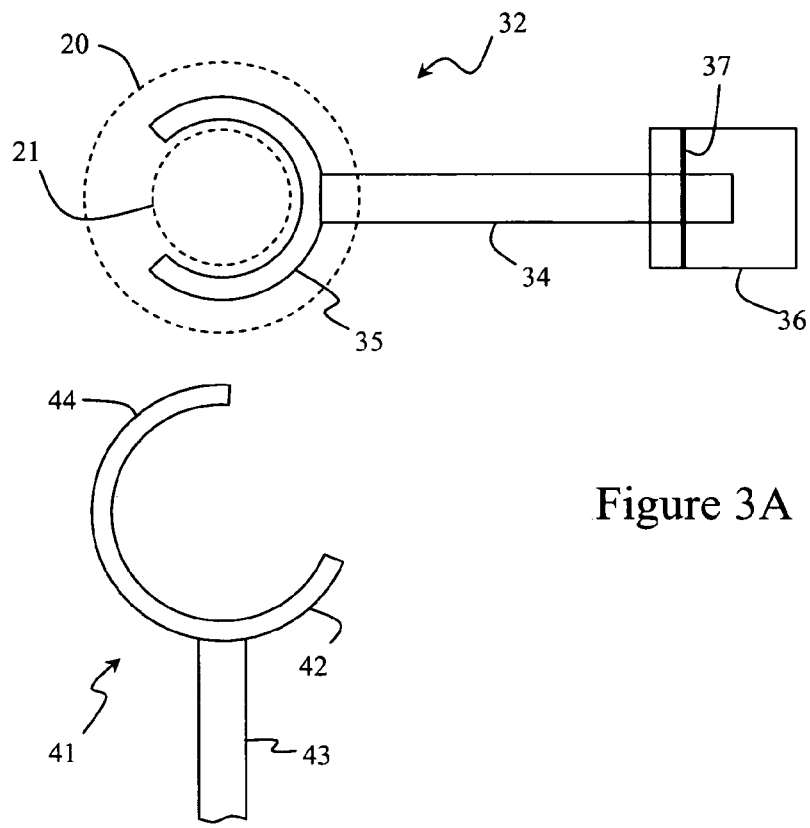
FIGS. 3A and 3B depict a mechanism to exchangeably position a selected stop disc in front of a lens of a projection system of the lithographic apparatus of FIG. 2.
Figure 3B:
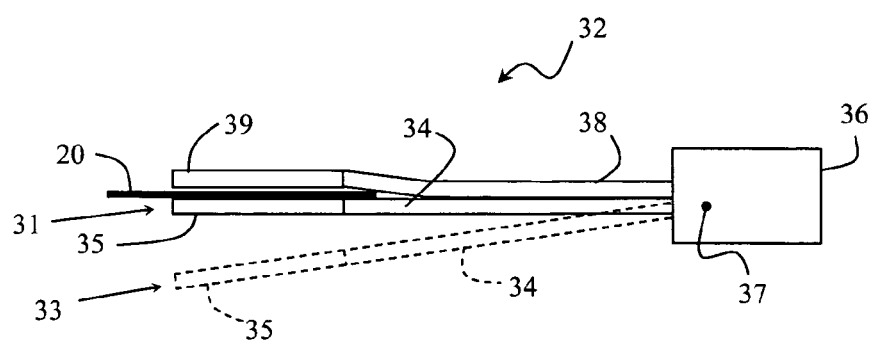

The NA stop disc 20 is mounted on a disc positioning mechanism 32 shown in plan view in FIG. 3A and in elevation in FIG. 3B. The disc positioning mechanism 32 includes a lift in the form of an elongate arm 34 ending in a fork 35. The stop disc 20 is supported on the fork 35. The other end of the elongate arm 34 is mounted on a support 36 via a pivot 37 which allows the arm 34 to pivot in the vertical plane. The support 36 is mounted on a base frame of the projection system PL.

A second arm 38 is rigidly attached to the support 36. The second arm 38 ends in a second fork 39, against which the stop disc 20 abuts when it is in the operational position. FIG. 3B shows the fork 35 in the operational position 31 using solid lines and in the loading position 33 using dashed lines. In operation, the second fork 39 is placed adjacent to the reflective element 19 whose NA is to be controlled.

As shown in FIG. 3A, there is associated with the disc positioning mechanism 32 a delivery mechanism 41 for introducing the stop disc 20 to the positioning mechanism 32. The delivery mechanism includes a shovel portion 42 upon which the stop disc 20 rests, mounted on a handling arm 43 which moves the shovel 42 in a horizontal direction. The shovel portion 42 includes a fork 44 whose arms are sufficiently widely spaced to allow fork 35 of the positioning mechanism to pass up between them, thus lifting the stop disc 20 off the shovel portion 42 and up into the operational position abutting the second fork 39.

Figure 4A:
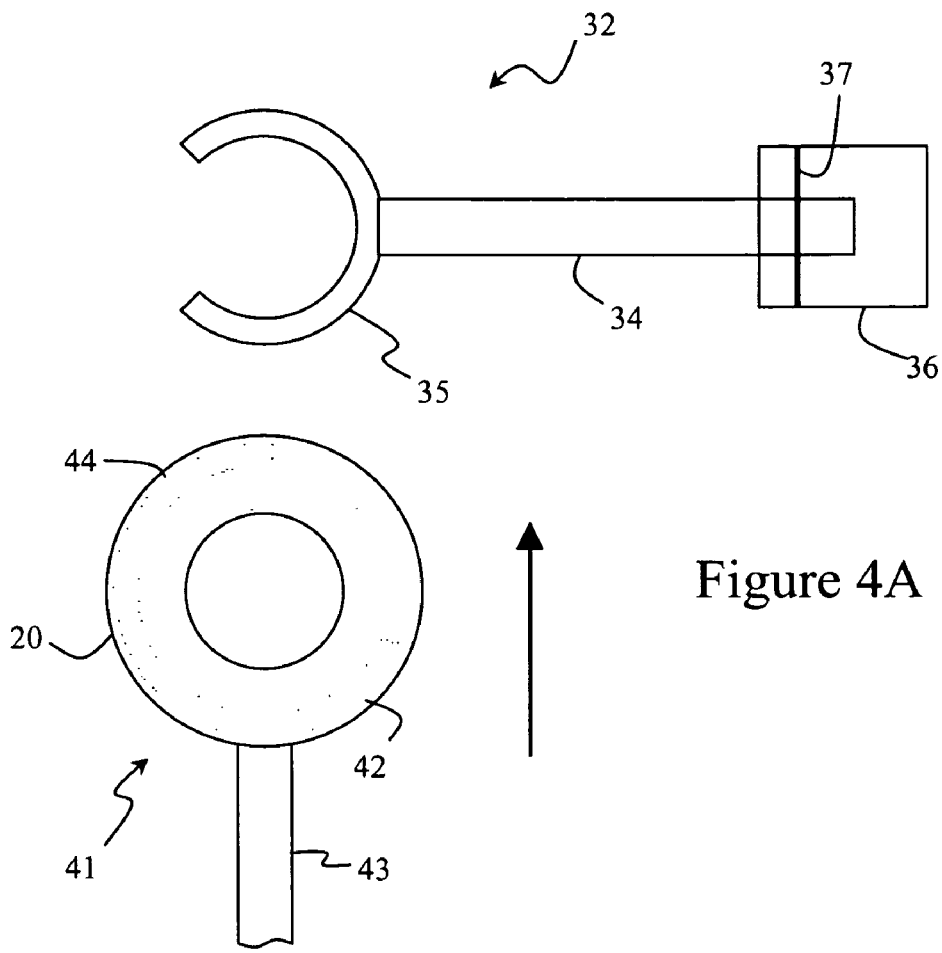
FIGS. 4A, 4B and 4C depict three stages in operation of the mechanism of FIG. 3A.
Figure 4B:
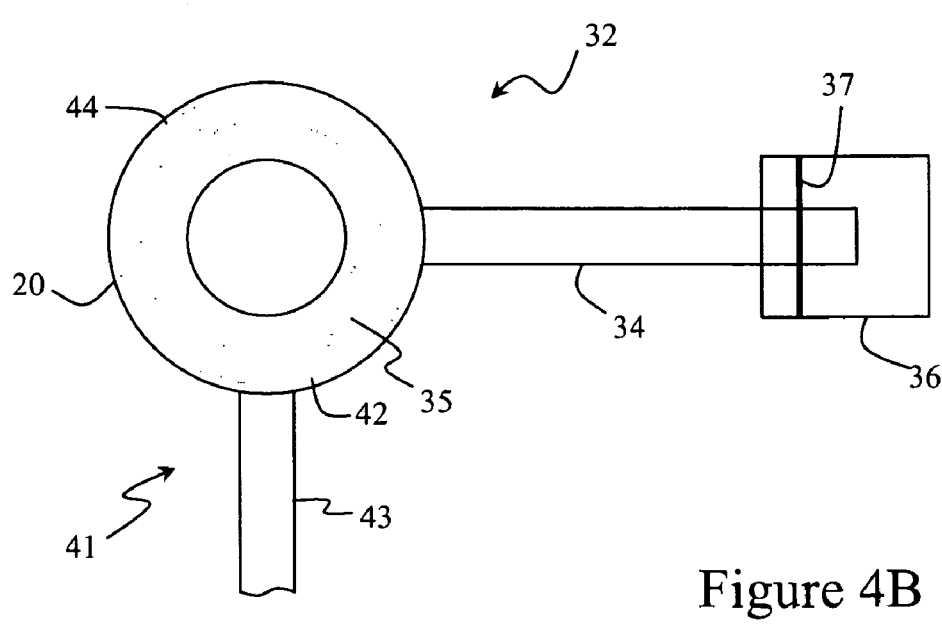
Figure 4C:
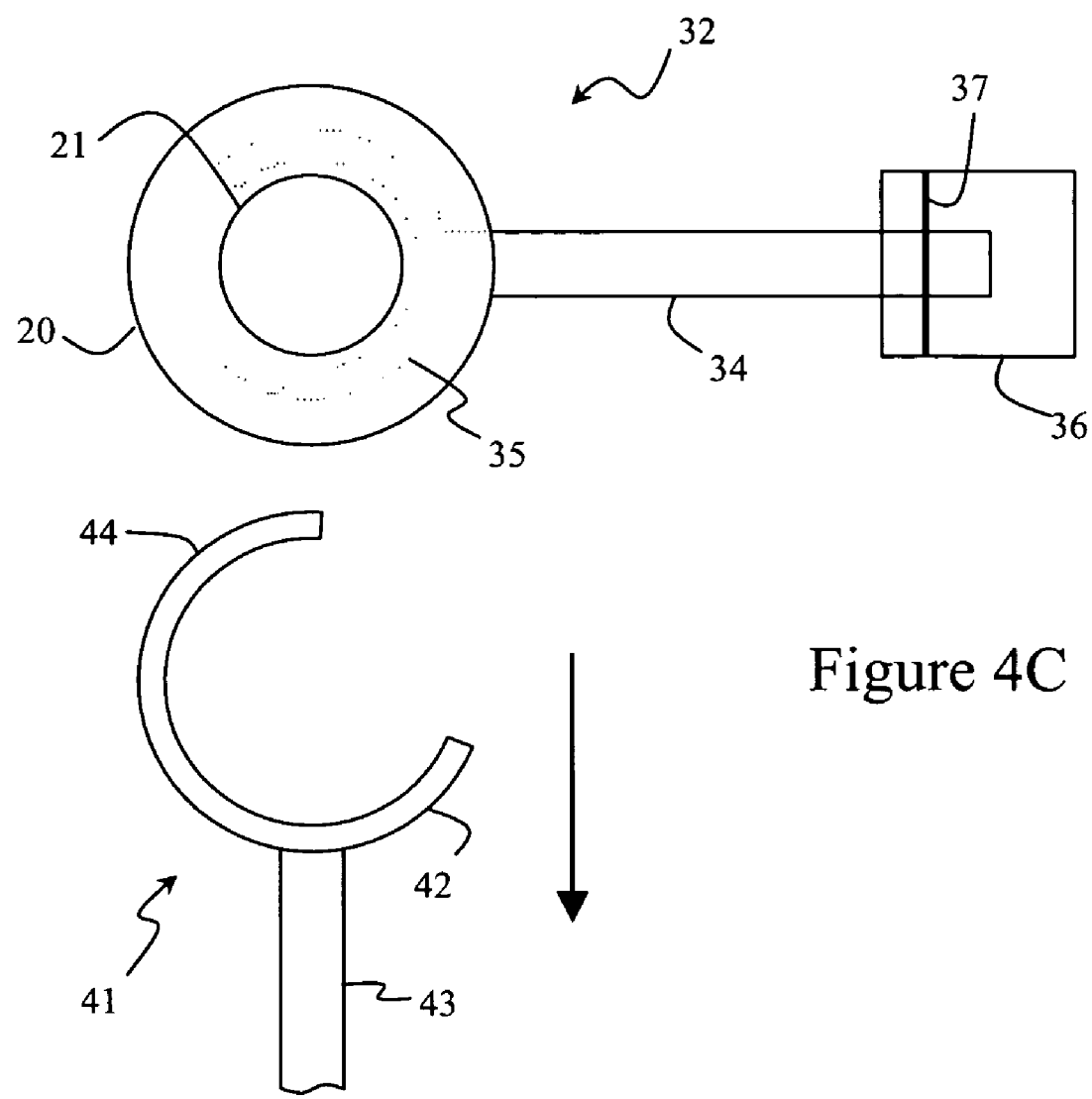

This operation is shown in more detail in FIGS. 4A, 4B and 4C. In the arrangement shown in FIG. 4A the stop disc 20 rests on the shovel portion 42 of the delivery mechanism 41. The shovel portion 42 is moved towards the positioning mechanism 32 by the handling arm 43. The arm 34 and fork 35 of the positioning mechanism 32 are in the loading position 33 shown in FIG. 3B.

FIG. 4B shows the situation when the shovel portion 42 and stop disc 20 reach the delivery mechanism 32. The shovel portion 42 and stop disc 20 move to a position directly above the fork 35. The elongate arm 34 pivots about the pivot point 37 so as to move the fork 35 up through the fork 44 of the shovel portion 42, thus lifting the stop disc 20 off the shovel 42. This moves the stop disc 20 into the operational position 31 shown in FIG. 3B.

FIG. 4C shows the situation when the stop disc 20 is in the operational position 31. Once the stop disc 20 has been lifted clear of the shovel portion 42 by the fork 35, the delivery mechanism 41 is retracted away from the positioning mechanism 32.

When a stop disc 20 is to be replaced, the above procedure takes place in reverse. The shovel portion 42 of the delivery mechanism 41 is moved into position beneath the stop disc 20 and fork 35 of the positioning mechanism. The stop disc 20 is lowered by the fork 35 as the elongate arm 34 pivots, and comes to rest on the fork 44 of the shovel portion 42. The fork 35 of the positioning mechanism 32 moves down through the fork 44 of the shovel 42 into the loading position 33. The shovel portion 42 and stop disc 20 are then withdrawn using the horizontal arm 43. Another stop disc may then be placed on the shovel portion 42 and inserted into position as described above.

Alternatives to the positioning mechanism 32 and delivery mechanism 41 described above can be envisaged. For example, the positioning mechanism 32 could include a fixed table (similar to the fork 35) on which the stop disc 20 is to be placed. The delivery mechanism 41 could be movable in a vertical as well as horizontal direction, so that it can move the stop disc horizontally into place and then lower it onto the fixed table before being retracted. Any suitable delivery mechanism and positioning mechanism may be used.

Figure 5:
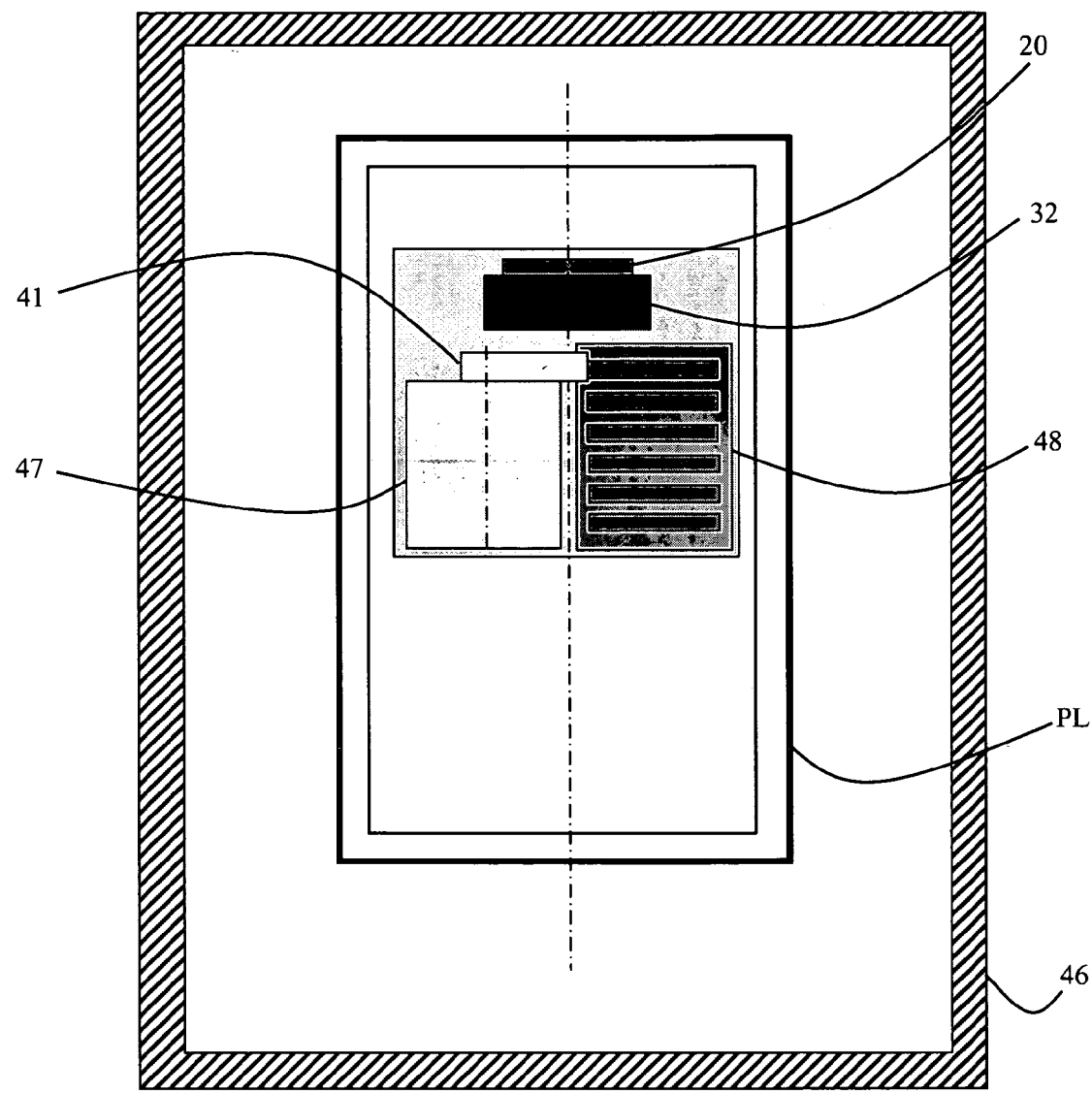
FIG. 5 depict the projection system of the lithographic apparatus of FIG. 2, the projection system including a disc changing mechanism.

FIG. 5 is a schematic depiction of the projection system PL located inside a controlled or purged environment or vacuum chamber 46. An NA stop disc 20 mounted on a disc positioning mechanism 32 (as described above) is shown in schematic form. The reflective element in front of which the stop disc 20 is mounted is not shown. Associated with the disc positioning mechanism 32 is a disc changing mechanism 47 and a magazine 48 supporting a plurality of stop discs.

When it is desired to change the NA stop of the reflective element, the stop disc 20 is removed from the operational position by the positioning mechanism 32. The stop disc 20 is then withdrawn by a delivery mechanism 41 to the disc changing mechanism 47 and placed in the magazine 48. Another stop disc 20 is then selected from the magazine 48 and transported via the delivery mechanism 41 to the positioning mechanism 32. The other stop disc 20 is then put in place in front of the reflective element.

It will be noted that in the arrangement shown in FIG. 5, the disc changing mechanism 47 and magazine 48 are located within the projection system PL which is located within vacuum chamber 46.

Figure 6:
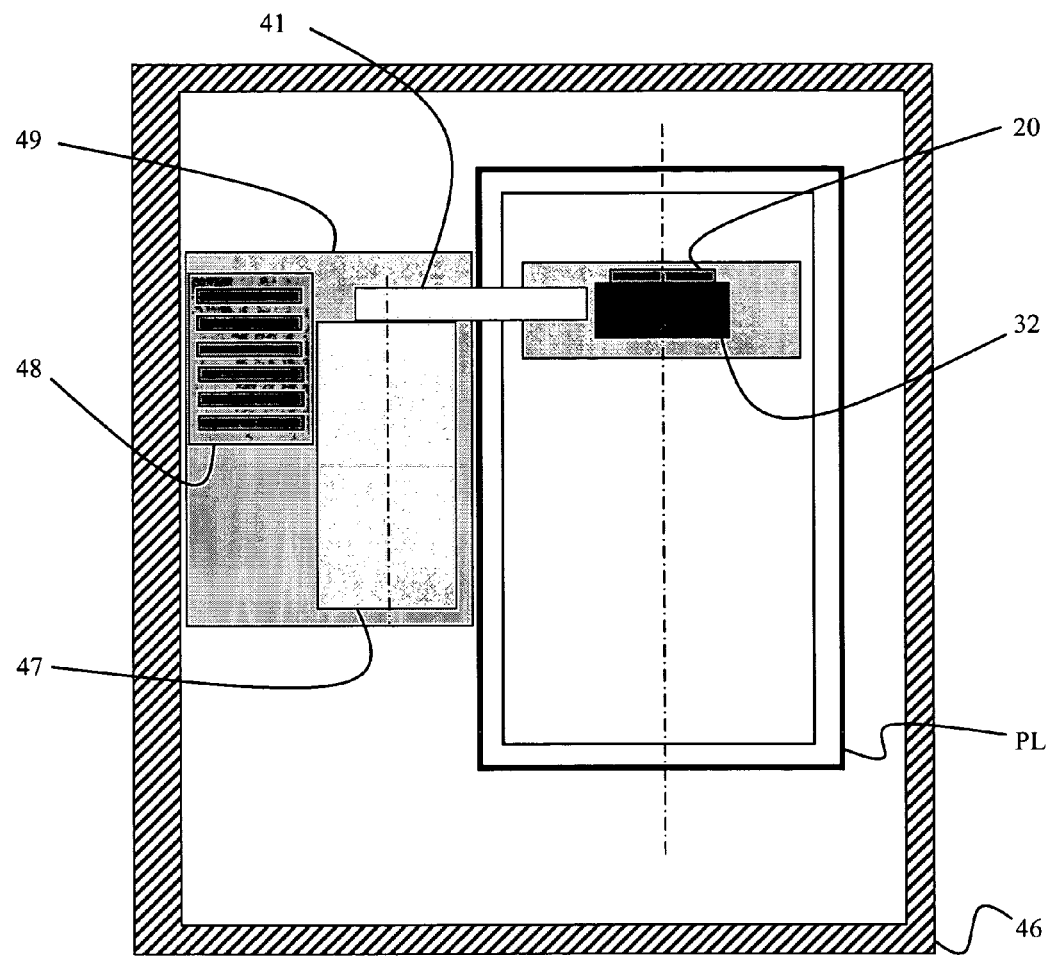
FIG. 6 depicts a modified projection system of the lithographic apparatus of FIG. 2, the projection system including a modified disc changing mechanism.

FIG. 6 is a schematic depiction of a modified projection system PL and disc changing system 49, both mounted inside a vacuum chamber 46. The disc changing system 49 is mounted external to the projection system PL, either on the vacuum chamber 46 or on a cooling system (not shown) for the projection system PL. The disc changing system 49 includes a disc changing mechanism 47 and magazine 48 like those shown in FIG. 5, together with a delivery mechanism 41 which transfers a stop disc 20 from the disc changing mechanism 47 outside the projection system PL to a disc positioning system 32 inside the projection system PL. Placing the disc changing system 49 outside the projection optics system 45 allows much easier access for repair and to change the stop discs held in the magazine 48.

Figure 7:
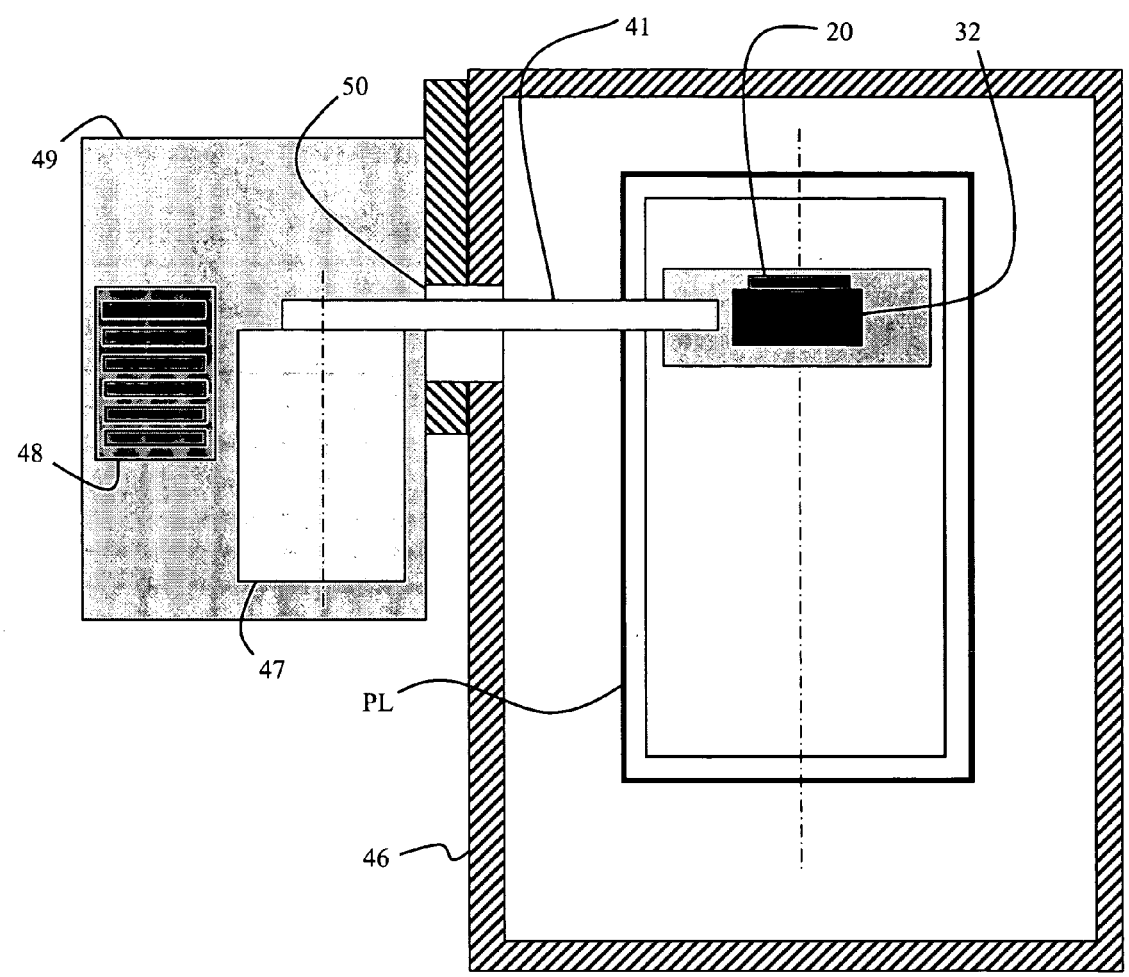
FIG. 7 depicts a further modified projection system of the lithographic apparatus of FIG. 2, the projection system including a further modified disc changing mechanism.

FIG. 7 is a schematic depiction of a further modified projection system PL and disc changing system 49. The arrangement is similar to that shown in FIG. 6 except that the disc changing system 49 is located outside the vacuum chamber 46 enclosing the projection system PL. The delivery mechanism 41 passes through a vacuum valve 50 to enable a stop disc 20 to be passed from the disc changing system 49 into the vacuum chamber 46 without breaking the vacuum. This arrangement allows access to the disc changing mechanism 47 and magazine 48 without the need to break the vacuum in the projection optics system. This allows for much easier repair of the mechanism or replacement of NA stop discs.

Figure 8:
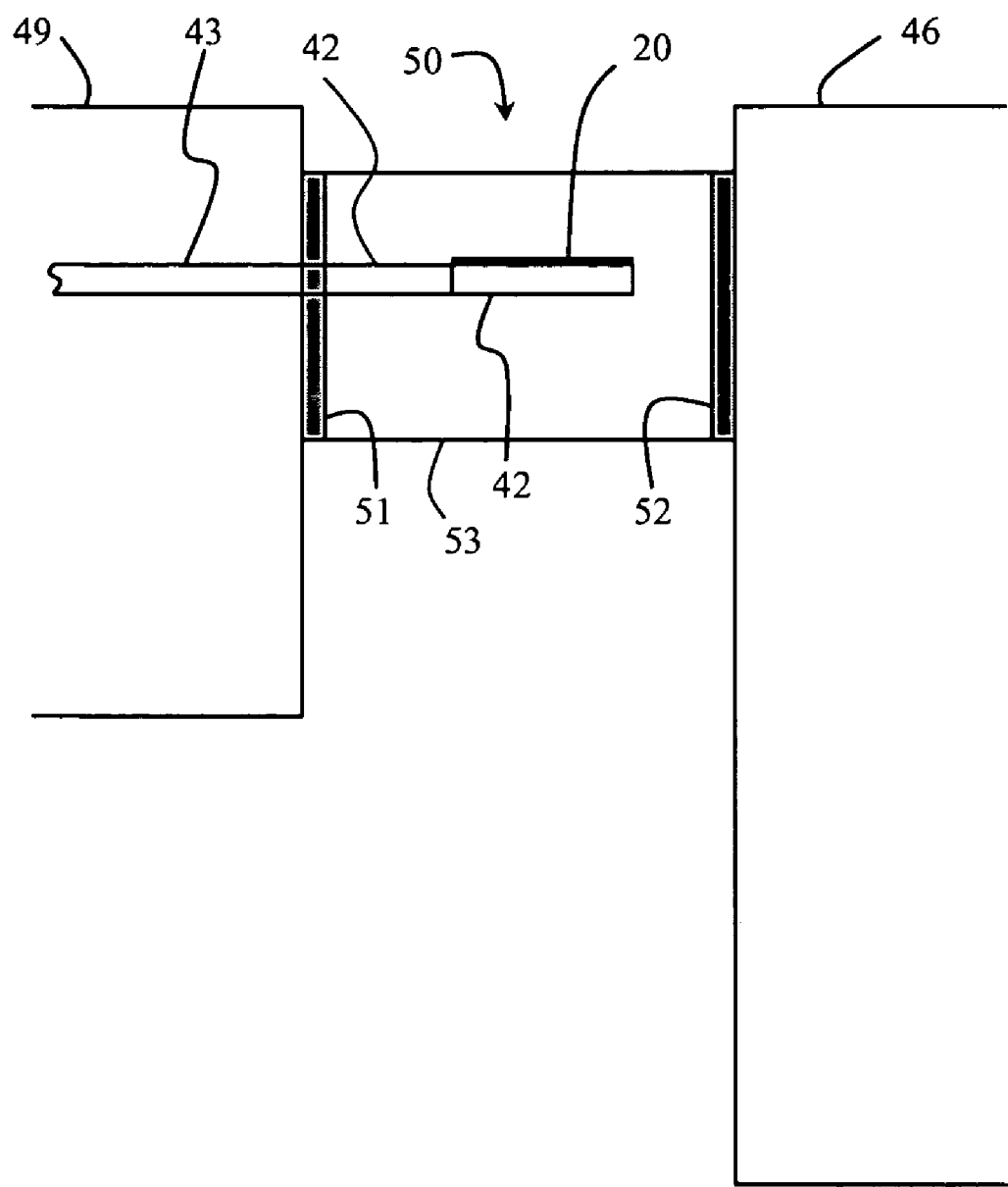
FIG. 8 depicts a vacuum lock for enabling a disc to pass into a projection optics system.

FIG. 8 is a schematic diagram of the vacuum valve 50 which enables the stop disc to be passed from the disc changing system 49 into the vacuum chamber 46 without breaking the vacuum. The vacuum valve 50 includes an airlock chamber 53 having a valve 51, 52 at each end. Initially the stop disc 20, resting on the shovel portion 42 of the delivery mechanism 14, is contained within the disc changing system 49. The first valve 51 is opened and the disc is inserted into the airlock chamber. The first valve 51 is then closed around the handling arm 43 of the delivery mechanism 41 and the airlock chamber is evacuated until it is under vacuum. The second valve 52 is then opened and the delivery mechanism 41 passes the stop disc into the vacuum chamber 46 and presents it to the positioning mechanism 32 as described earlier. The shovel portion is then retracted into the airlock chamber 53 and the second valve 52 closed. The airlock chamber is then brought up to atmospheric pressure, the first valve 51 opened and the shovel retracted into the disc changing mechanism 49. To remove a stop disc from the vacuum chamber 46 the above sequence of events is operated in reverse.

Optionally the disc changing system 49 may be enclosed within a second vacuum chamber (not shown), separate from the vacuum chamber 46 enclosing the projection system PL. This arrangement allows the disc changing mechanism 47 and magazine 48 to be kept under vacuum, reducing the risk of contamination.

Referring now to FIGS. 9(a) to (h), there are shown a plurality of stop discs 20a to 20h, which can be provided in the projection systems PL of FIGS. 5, 6 and/or 7. Each disc 20a to 20h includes a member having a different aperture. Stop disc 20a has a circular aperture of a first size, stop disc 20b has a circular aperture of a second size greater than the first size, stop disc 20c has an elliptical aperture, stop disc 20d has an aperture with a central obscuration.

Stop disc 20e has a square aperture, stop disc 20f has a hexagonal aperture, and stop disc 20g has a plurality of circular apertures.

An elliptical aperture is especially useful for off-axis reflective (or catadioptric) systems (e.g. EUV projection systems) since they are, by nature, slightly elliptical. This means that errors made within the projection system PL can be compensated for within the module. Refractive projection systems are on-axis and therefore in general not elliptical. An elliptical aperture, however, could be used to correct errors from other modules, e.g. ellipticity of the illuminator, Horizontal-Vertical (H-V) bias on the mask (unwanted difference of linewidth with orientation).

Figure 9:
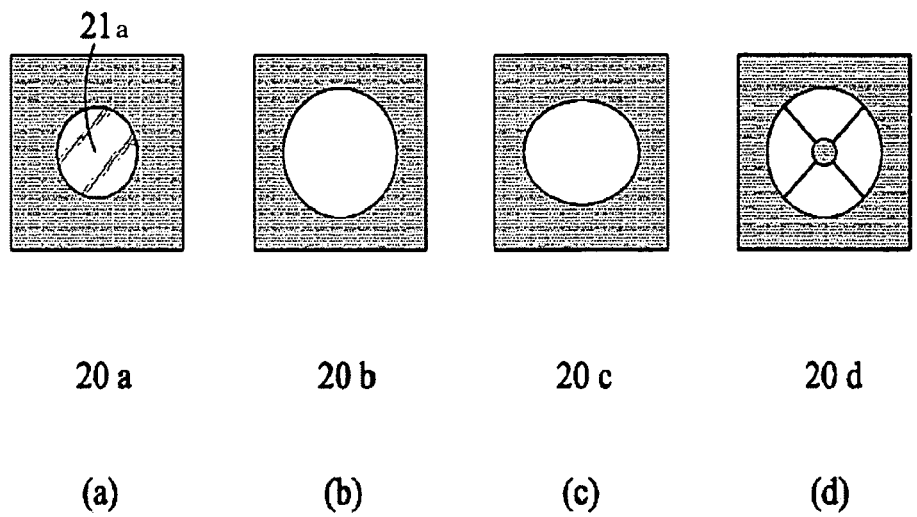
FIGS. 9(*a*) to (*h*) depict front views of a plurality of stop discs or blades for use in the lithographic apparatus of FIG. 2.
Figure 9:
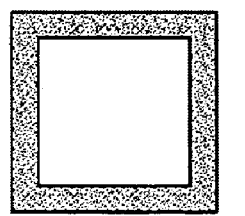
Figure 9:
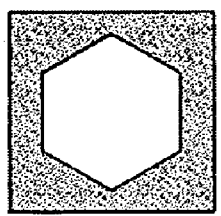
Figure 9:
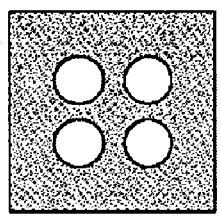
Figure 9:
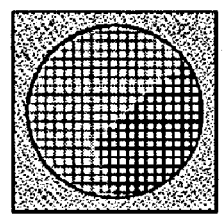

It will be appreciated that the aperture shapes of the stop discs 20a to 20h of FIG. 9, are just examples of likely or possible shapes. In principle, all kinds of shapes of aperture (and obscuration area) could be provided. For example, square or hexagonal apertures. An optical shape for any given situation will be a function of illumination mode and structure to be imaged. It is furthermore possible that the shape of the aperture of the selected stop disc can be optimized together with the illumination mode and/or mask layout.

Another effect which can be corrected by the present invention is lens apodization. This is the effect that the lens transmission depends on the position in the lens pupil through which the light ray passes. Correction is possible with a filter in the pupil having a certain transmission profile. One implementation would be a fine mesh with varying mesh density leading to the desired transmission correction.

The aperture of any of the stop discs 20a to 20h can be provided with a filter member or membrane 21a. This is a piece of correction optics that corrects aberrations in the pupil plane. For a transmissive system a plane-plate can be used with extremely small thickness variations (of the order of nm's). Most effective is the correction of higher order aberrations for which no lens manipulators exist. Aberrations induced by the thickness of the plate, should be corrected for during lens set-up or, possibly, taken into account during lens adjustment and/or design. For EUV the membrane has to be extremely thin (<100 nm for Si) to limit the absorption. A net-like support frame may be necessary.

Stop disc 20h has a circular aperture and may be used to correct for pupil apodization. In the aperture a wire mesh (or something similar) is provided. By creating a mesh with a variable transmission, the transmission over the pupil can be tuned. In FIG. 9(h) there are two area's with a different transmission. In most cases, however, a gradual variation over the pupil should be provided. A mesh with variable transmission can be created by varying the width of the mesh wires or the density of the mesh. Additional requirements to the mesh may include that: the nominal transmission should be close to 100% (implying that the mesh is not dense) and it should not significantly influence the angular distribution of the radiation passing it.

While specific embodiments of the invention have been described above, it will be appreciated that the invention may be practiced otherwise than as described. The description is not intended to limit the invention.

Particularly, it will be appreciated that the present invention proposes a solution to the problem of unsuitability of adjustable diaphragms by providing a series of individual stop discs, each having an opening with a fixed aperture, to adjust the NA stop. The stop discs are loaded into a mechanical disc changer mechanism (analogous to a "juke box"), which can place one of the discs at a time in the pupil of the projection system. A single stop disc occupies considerably less space than an adjustable diaphragm, and enables the shape of the NA stop to be determined more accurately.

It will be appreciated that departures from the above described embodiments may still fall within the scope of the invention. For example, the lithographic apparatus described includes a reflective reticle and a projection system including reflective elements, but a transmissive reticle and/or elements in the projection system may also be used. Furthermore, the apparatus has been described for use with EUV radiation but it will be appreciated that radiation of other wavelengths, for example 193 nm, may also be used.

In addition, the description above describes the arrangements required to change the NA of the projection system of a lithographic apparatus. The illumination system also has a numerical aperture and the methods and apparatus used to control the NA of the projection system can equally be used to control the NA of the illumination system.

In a further modification, it will be understood that the projection system may be operated in a controlled environment which does not include a vacuum. For example, some projection systems operate in a system purged with nitrogen gas. The systems described above for moving stop discs into and out of a vacuum chamber apply equally to any controlled environment. It may not even be necessary to provide an enclosed chamber. For example, in purge systems in which the gas is heavier or lighter than air, one or more walls can be omitted.

What is claimed is:

1. A lithographic apparatus, comprising:
   a support configured to support a patterning device, the patterning device configured to impart a pattern to a beam of radiation;
   a substrate table configured to hold a substrate;
   a projection system configured to project the patterned beam onto a target portion of the substrate; and
   a stop changer configured to exchangeably place a selected one of a plurality of separable stop discs in the projection system and adjacent to a focusing element of the lithographic apparatus, the selected stop disc selected from a group of two or more of the following: a first disc having a circular aperture of a first size, a second disc having a circular aperture of a second size greater than the first size, a disc having an aperture with a central obscuration, a disc having a square aperture, a disc having a hexagonal aperture, and a disc to correct pupil apodization, a size of an aperture of the selected stop disc determining a numerical aperture of the projection system.

2. A lithographic apparatus as claimed in claim 1, wherein the focusing element is provided in the projection system.

3. A lithographic apparatus as claimed in claim 1, wherein the selected stop disc is exchangeably placeable in or adjacent to a pupil plane of the focusing element.

4. A lithographic apparatus as claimed in claim 1, wherein the selected stop disc is exchangeably placeable in or near a pupil plane of the projection system.

5. A lithographic apparatus as claimed in claim 1, wherein the focusing element reflects and/or refracts the beam of radiation.

6. A lithographic apparatus as claimed in claim 1, wherein the stop changer comprises a disc positioning mechanism configured to selectively place one of the stop discs adjacent the focusing element.

7. A lithographic apparatus as claimed in claim 6, wherein the stop changer comprises a disc changing mechanism configured to select one of the stop discs and provide the selected stop disc to the disc positioning mechanism.

8. A lithographic apparatus as claimed in claim 7, wherein the disc changing mechanism comprises a receptacle to store the stop discs not supplied to the disc positioning mechanism.

9. A lithographic apparatus as claimed in claim 1, further comprising the plurality of stop discs.

10. A lithographic apparatus as claimed in claim 1, wherein the plurality of stop discs each comprise an aperture different from the apertures of each of the other stop discs.

11. A lithographic apparatus as claimed in claim 1, wherein an aperture of at least one of the plurality of stop discs is provided with a filter or membrane or mesh.

12. A lithographic apparatus as claimed in claim 1, wherein the selected stop disc is provided before the focusing element such that, in use, radiation passes through the aperture of the selected stop disc prior to reaching the focusing element.

13. A lithographic apparatus as claimed in claim 7, further comprising a disc delivery mechanism configured to deliver a selected stop disc from the disc changing mechanism to the disc positioning mechanism.

14. A lithographic apparatus as claimed in claim 7, further comprising a magazine configured to hold the plurality of stop discs when not in use.

15. A lithographic apparatus as claimed in claim 1, wherein the focusing element is a lens, a reflective lens, or a mirror.

16. A lithographic apparatus as claimed in claim 1, wherein the beam of radiation has a wavelength between about 5 nm and about 400 nm.

17. A lithographic apparatus as claimed in claim 1, wherein the beam of radiation has a wavelength between about 5 nm and about 20 nm.

18. A device manufacturing method, comprising:
providing a beam of radiation using an illumination system;
patterning the beam of radiation;
projecting the patterned beam of radiation onto a target portion of a substrate at least partially covered by a layer of radiation sensitive material using a projection system;
selecting one of a plurality of separable stop discs from a group of two or more of the following: a first disc having a circular aperture of a first size, a second disc having a circular aperture of a second size greater than the first size, a disc having an aperture with a central obscuration, a disc having a square aperture, a disc having a hexagonal aperture, and a disc to correct pupil apodization; and
adjusting a numerical aperture of a focusing element of the projection by exchangeably placing the selected stop disc in the projection system and adjacent the focusing element, a size of an aperture of the selected stop disc determining a numerical aperture of the projection system.

19. A method according to claim 18, wherein adjusting the numerical aperture further comprises: removing the selected stop disc from a position adjacent the focusing element; and exchanging the selected stop disc with a further selected stop disc having an aperture different than an aperture of the selected stop disc.

20. A lithographic apparatus, comprising:
an illumination system configured to provide an EUV beam of radiation;
a support configured to support a patterning device, the patterning device configured to impart a pattern to the beam of radiation;
a substrate table configured to hold a substrate;
a projection system configured to project the patterned EUV beam of radiation onto a target portion of the substrate; and
a stop changer configured to exchangeably place a selected one of a plurality of separable stop discs in the projection system and at a position within the EUV beam of radiation to shape and/or filter the EUV beam of radiation, the selected stop disc selected from a group of two or more of the following: a first disc having a circular aperture of a first size, a second disc having a circular aperture of a second size greater than the first size, a disc having an aperture with a central obscuration, a disc having a square aperture, a disc having a hexagonal aperture, and a disc to correct pupil apodization, a size of an aperture of the selected stop disc determining a numerical aperture of the projection system.

* * * * *